(12) United States Patent
Lutgen et al.

(10) Patent No.: US 9,773,896 B2
(45) Date of Patent: Sep. 26, 2017

(54) LAYER STRUCTURE FOR A GROUP-III-NITRIDE NORMALLY-OFF TRANSISTOR

(71) Applicant: AZURSPACE Solar Power GmbH, Heilbronn (DE)

(72) Inventors: Stephan Lutgen, Dresden (DE); Saad Murad, Freital (DE)

(73) Assignee: AZURSPACE Solar Power GmbH, Heilbronn (DE)

( * ) Notice: Subject to any disclaimer, the term of this patent is extended or adjusted under 35 U.S.C. 154(b) by 91 days.

(21) Appl. No.: 14/828,342

(22) Filed: Aug. 17, 2015

(65) Prior Publication Data
US 2015/0357454 A1    Dec. 10, 2015

Related U.S. Application Data

(63) Continuation of application No. PCT/EP2014/052960, filed on Feb. 14, 2014.

(30) Foreign Application Priority Data

Feb. 15, 2013    (EP) ..................................... 13155547

(51) Int. Cl.
*H01L 29/15* (2006.01)
*H01L 31/0256* (2006.01)
(Continued)

(52) U.S. Cl.
CPC ........ *H01L 29/778* (2013.01); *H01L 29/1075* (2013.01); *H01L 29/2003* (2013.01); *H01L 29/205* (2013.01); *H01L 29/7783* (2013.01)

(58) Field of Classification Search
USPC .................................................. 257/76, 194
See application file for complete search history.

(56) References Cited

U.S. PATENT DOCUMENTS

| 5,021,857 | A | * | 6/1991 | Suehiro | ............ | H01L 21/30621 |
|---|---|---|---|---|---|---|
| | | | | | | 257/194 |
| 7,211,839 | B2 | * | 5/2007 | Kachi | ................. | H01L 29/7786 |
| | | | | | | 257/183 |

(Continued)

FOREIGN PATENT DOCUMENTS

| JP | 2007-109830 A | 4/2007 |
|---|---|---|
| JP | 2008-010803 A | 1/2008 |

OTHER PUBLICATIONS

Pryce et al., "Plasmonic nanoparticle enhanced photocurrent in GaN/InGaN/GaN quantum well solar cells," Appl. Phys. Lett., vol 96, pp. 153501-1-153501-3 (2010).

(Continued)

*Primary Examiner* — Olik Chaudhuri
*Assistant Examiner* — Wilner Jean Baptiste
(74) *Attorney, Agent, or Firm* — Muncy, Geissler, Olds & Lowe, P.C.

(57) ABSTRACT

A layer structure for a normally-off transistor has an electron-supply layer made of a group-III-nitride material, a back-barrier layer made of a group-III-nitride material, a channel layer between the electron-supply layer and the back-barrier layer, made of a group-III-nitride material having a band-gap energy that is lower than the band-gap energies of the other layer mentioned. The material of the back-barrier layer is of p-type conductivity, while the material of the electron-supply layer and the material of the channel layer are not of p-type conductivity, the band-gap energy of the electron-supply layer is smaller than the band-gap energy of the back-barrier layer. In absence of an external voltage a lower conduction-band-edge of the third group-III-nitride material in the channel layer is higher in energy than a Fermi level of the material in the channel layer.

20 Claims, 8 Drawing Sheets

(51) Int. Cl.
*H01L 29/778* (2006.01)
*H01L 29/205* (2006.01)
*H01L 29/10* (2006.01)
*H01L 29/20* (2006.01)

(56) References Cited

U.S. PATENT DOCUMENTS

| | | | |
|---|---|---|---|
| 2003/0102482 A1* | 6/2003 | Saxler | H01L 29/7783 257/85 |
| 2007/0164314 A1* | 7/2007 | Beach | H01L 29/7787 257/194 |
| 2009/0045438 A1* | 2/2009 | Inoue | H01L 29/155 257/192 |
| 2009/0072272 A1* | 3/2009 | Suh | H01L 29/1066 257/194 |
| 2010/0258841 A1 | 10/2010 | Lidow et al. | |

OTHER PUBLICATIONS

Khan et al., "Enhancement and depletion mode GaN/AlGaN heterostructure field effect transistors," Appl. Phys. Lett., vol. 68, No. 4, pp. 514-516 (1996).

Kumar et al., "High-transconductance enhancement-mode AlGaN/Gan HEMTs on SIC substrate," Electron. Lett., vol. 39, No. 24, pp. 1-2 (Nov. 27, 2003).

Cai et al., "High-Performance Enhancement-Mode AlGaN/GaN HEMTs Using Fluoride-Based Plasma Treatment," IEEE Elec. Dev. Lett., vol 26, No. 7, pp. 435-437 (Jul. 2005).

Mizutani et al., "AlGaN/GaN HEMTs With Thin InGaN Cap Layer for Normally Off Operation," IEEE Elec. Dev. Lett., vol 28, No. 7, pp. 549-551 (Jul. 2007).

\* cited by examiner

LAYER STRUCTURE FOR A GROUP-III-NITRIDE NORMALLY-OFF TRANSISTOR

This nonprovisional application is a continuation of International Application No. PCT/EP2014/052960, filed on Feb. 14, 2014, which claims priority to European Patent Application No. 13155547.6, filed on Feb. 15, 2013, both of which are herein incorporated by reference.

BACKGROUND OF THE INVENTION

Field of the Invention

The present invention relates to a group-III-nitride layer structure for a normally-off transistor. The invention further relates to a wafer comprising such a layer structure on a substrate, to a normally-off transistor, in particular a high-electron-mobility transistor (HEMT), and to an integrated circuit.

Description of the Background Art

Group-III-nitride heterojunction field effect transistors (HFETs) are widely investigated for high power switching applications. Most of the reported HFETs are AlGaN/GaN HFETs of the normally-on type, taking advantage of the inherent high sheet carrier density caused by a built-in polarization electric field.

However, such normally-on HFETs are not useful for actual power switching applications, in which safety-off operation is the main concern. Thus, in these applications, Si-based power MOSFETs/IGBTs have been exclusively used so far.

Normally-off operation, i.e., transistor operation in an off-state at a gate-source voltage of 0V or, more generally speaking, at gate-source voltages below a threshold voltage amount, is strongly desired for AlGaN/GaN HFETs. At the same time, it is desired to achieve a low on-state resistance of the transistor. In order to meet such requirements, it is necessary to reduce the two-dimensional electron gas (2DEG) density in the channel under the gate for gate-voltages <0V. Since the 2DEG is caused by a difference of polarization-induced fixed charges between the GaN and AlGaN layers at the heterointerface, a reduction of the Al mole fraction or of the thickness of AlGaN effectively reduces those carriers and thereby shifts a threshold voltage Vth for on-state operation toward the positive direction. This approach was reported in the publication M. A. Khan, Q. Chen, C. J. Sun, J. W. Yang, M. Blasingame, M. S. Shur, and H. Park, "Enhancement and depletion mode GaN/AlGaN heterostructure field effect transistors," Appl. Phys. Lett. vol. 68, no. 4, 514-516 (1996), hereinafter Khan et al. This approach can produce the normally-off operation. However, the resultant drain current is very low, since the applicable positive gate voltage is limited by a relatively low barrier height with high sheet resistance at the GaN/AlGaN heterointerface. Thus, the desired reduction of the on-state resistance is limited with this approach. This approach also lacks the ability to drive the gate with a high positive voltage typically. Instead, the driving voltage is typically limited to less than 2V. Khan et al. describe a device featuring a very thin AlGaN barrier layer with a threshold voltage Vth<50 mV.

Several different approaches to the design of normally-off HEMTs have been published in the past years. One structure is found in Kumar V, Kuliev A, Tanaka T, Otoki Y, Adesida I., "High transconductance enhancement mode AlGaN/GaN HEMTs on SiC substrate", Electron Lett. 2003; 39 (24): 1758-60. The authors report Vth=75 mV for a recessed gate device.

Cai et al., in Cai Y, Zhou Y, Chen K, Lau K., "High-performance enhancement-mode AlGaN/GaN HEMTs using fluoride-based plasma treatment", IEEE Elec Dev Lett. 2005; 26 (7):435-7, rely on fluoride-based plasma treatment to achieve a threshold voltage of Vth=900 mV. While the last method can deliver a normally-off device, stability concerns as well as degradation of the device performance due to either recess etching or F ion treatment under high voltage and high temperature operations have limited this approach to R&D work only.

A more recent approach proposed by Mizutani et al. in Mizutani T, Ito M, Kishimoto S, Nakamura F., "AlGaN/GaN HEMTs with thin InGaN cap layer for normally off operation", IEEE Elec Dev Lett. 2007; 28 (7):549-51 adopts a thin InGaN cap layer, which raises the conduction band, thereby achieving a normally-off operation. While being good at achieving positive threshold voltage, reliability of a recess etching, which is still required between Gate and Drain contacts to lower the on-state resistance, are major issues with this approach.

Due to the inherent difficulties in achieving a normally-off nitride-based HEMTs, a normally-on HEMT can also be used in a cascaded configuration with a Si FET to make a normally-off device (U.S. Pat. No. 8,084,783). This approach can realize a normally-off GaN HEMT with threshold voltage of up to 4V, but also suffers from additional chip integration and relies on a slow internal body of the Si FET.

SUMMARY OF THE INVENTION

It is therefore an object of the present invention to provide a group-III-nitride layer structure for a normally-off transistor comprises an electron-supply layer made of at least one first group-III-nitride material having a first band-gap energy; a back-barrier layer made of at least one second group-III-nitride material having a second band-gap energy; a channel layer, which is arranged between the electron-supply layer and the back-barrier layer and which is made of a third group-III-nitride material having a third band-gap energy that is lower first and second band-gap energies, wherein the second group-III-nitride material of the back-barrier layer is of p-type conductivity, while the first group-III-nitride material of the electron-supply layer and the third group-III-material of the channel layer are not of p-type conductivity, the first band-gap energy of the first group-III-nitride material of the electron-supply layer is smaller than the second band-gap energy of the second group-III-nitride material of the back-barrier layer.

The group-III-nitride layer structure can be also referred to in short as the layer structure.

In exemplary embodiments of the layer structure, in absence of an external voltage applied to the layer structure, a lower conduction-band edge of the third group-III-nitride material in the channel layer is higher in energy than a Fermi level of the third group-III-nitride material in the channel layer.

The layer structure can be fabricated by a comparatively simple process. In particular, the layer structure of the present invention allows fabricating a normally-off (also called e-mode) transistor from the layer structure according to an embodiment with a device performance that is superior in several key parameters with a uniquely high on-wafer device yield.

An important advantage is that the layer structure allows fabricating embodiments that are normally-off transistors having a recess-free design. This is an important advantage because based on the layer structure of the present invention a significant simplification of the processing for the finalization of a normally-off transistor after the fabrication of the layer structure is achieved. This in turn allows a significant cost reduction for such transistor embodiments.

Such advantages are achieved in the exemplary transistor embodiments that make use of the advantageous properties of the layer structure of the present invention. In particular, the layer structure of the present invention achieves a very good carrier confinement to the channel layer by a double heterostructure design avoiding electron current loss in a transistor structure employing the layer structure.

This effect is achieved by a combination of features of the layer structure. In particular, the layer structure of the present invention utilizes a p-type back-barrier layer creating an intrinsic, hole-generated electric field under a main channel region in the channel layer to lift the lower conduction-band edge above the Fermi level. In addition, the back-barrier layer having a band-gap that is wider than that of the electron supply layer, supports this effect. Thus, by the insertion of the at least one second group-III nitride material in the back-barrier layer having an energy-band gap with a higher energy amount than the first group-III-nitride material of the electron supply layer, and, in addition, by providing the back-barrier layer as a p-type layer, the overall lower conduction-band edge of the channel layer is found at higher energy values than the Fermi level. Thus, as the p-doped back-barrier layer raises the lower conduction-band edge at the main 2DEG region of a transistor structure, the resulting device threshold-voltage has positive values.

The layer structure of the present invention at the same time achieves good conductivity modulation properties. This new concept also enables a combination of both normally-off operation and high current-driving capability in a transistor made with the layer structure, by applying a relatively high positive gate voltage, at the same time achieving a low gate current. The group-III-nitride layer structure of the present invention also allows achieving a high drain current.

While in known HEMTs with a GaN buffer layer below the channel layer there is an insufficient confinement of electrons to the bottom side which may give rise to punch-through effects even at low drain voltages and closed channel conditions, such a punch-through effect is prevented by the layer structure of the present invention.

It is noted that the electron-supply layer can also be referred to as the barrier layer or as the Schottky-barrier layer.

The structure of a normally-off or e-mode transistor made from the layer structure of the present invention may be called a p-doped double heterojunction transistor or p-doped back-barrier transistor.

Also, the layer structure can also be traded in the form of an intermediate product such as an epiwafer carrying the layer structure as an epitaxial layer stack on a substrate. The epiwafer serves as a basis for further processing in the fabrication of a transistor wafer or of individual transistors. The layer structure can also takes the form of an integrated circuit comprising the inventive layer structure in a normally-off transistor that is monolithically integrated with other circuit elements.

The exact value of the positive transistor threshold voltage that can be achieved with the layer structure depends on several factors, amongst which are, for example, the channel layer thickness and the amount of the p-type doping in the back-barrier layer. By optimizing the layer structure, a threshold voltage shift of more than 1.5V, even 2 to 6 V, can be achieved, as will be described in more detail further below.

The group-III-nitride layer structure can have the back-barrier layer and the electron-supply layer as AlGaN layers, whereas the channel layer is made of GaN. In this type of embodiments, the back-barrier layer has an Al mole fraction that is higher than that of the electron-supply layer. This allows achieving a threshold voltage with a particularly high positive value. In one such embodiment, the electron-supply layer comprises AlGaN having an Al mole fraction of at least 15% and not more than 26%, while the back-barrier layer comprises AlGaN having Al mole fraction of at least 25%. If the electron-supply layer has an Al mole fraction of 26%, the Al mole fraction of the back-barrier layer is higher than 26%. An Al mole fraction of 40% currently appears as an upper limit in view of the desired crystalline quality of the grown layers. However, where fabrication technology allows high-quality films with higher Al mole fractions, such compositions would be fully suitable for use within the context of the present invention.

The electron-supply layer or the back-barrier layer or both may have a changing composition across their respective extension in the layer-growth direction (depth direction). In one embodiment, the electron-supply layer comprises AlGaN and exhibits a compositional gradient in that an Al mole fraction of the a first group-III-nitride material of the electron-supply layer is higher at a smaller first distance from the channel layer in the depth direction than at a larger second distance from the channel layer. The compositional gradient is in one embodiment continuous across the thickness of the electron-supply layer. In another embodiment it takes the form of one or more steps of the composition of Al and Ga. In another embodiment, the compositional gradient does not change monotonously, but comprises at least one sequence of an increase followed by a decrease of either the Al or the Ga mole fraction across the thickness of the electron-supply layer. A compositionally graded back-barrier layer has the advantage of allowing a fabrication of the layer with a particularly high crystalline quality in comparison with a back-barrier layer of homogeneous composition. A higher crystalline quality is achieved especially where the compositional reduces a tensile strain and an unintentional background doping level in the back-barrier layer.

By using a higher Al mole fraction in the back-barrier layer, a better confinement of the electrons in the channel layer can be achieved. This has an added advantage as it does not need complicated device processing or additional processing steps, such gate recessing or ion treatment to achieve the desired threshold voltage.

In an embodiment, the back-barrier layer comprises AlGaN, and an Al mole fraction of the second group-III-nitride material of the back-barrier layer at a first distance from the channel layer and at a second distance from the channel layer differ from each other. Different embodiments employ a back-barrier layer with a compositional gradient of Al and Ga, continuous or stepwise, or with a superlattice, such as an AlGaN/GaN superlattice.

In exemplary embodiments having a varying composition of either the electron-supply layer, the back-barrier layer, or both, the back-barrier layer can have a maximum band-gap energy that is larger than a maximum band-gap energy of the electron-supply layer. The maximum band-gap energy is the largest band-gap energy achieved in the varying electron-supply layer material or the varying back-barrier-layer material when plotting the band-gap energy as a function of position in the depth direction. Of course, in case of a homogeneous composition throughout the respective layer, its maximum band-gap energy is simply its band-gap energy.

The threshold voltage of a normally-off transistor employing the layer structure of the present invention can be adjusted without loss in electrical properties by a wide range of doping in the back-barrier layer. Preferably, the back-barrier layer has a p-type dopant concentration of at least $1 \times 10^{17}$ cm-3 to achieve a hole concentration of at least $1 \times 10^{17}$ cm-3. In another embodiment, the back-barrier layer has a p-type-dopant concentration of at least $5 \times 10^{17}$ cm-3 to achieve a hole concentration of at least $5 \times 10^{17}$ cm-3. The p-type-dopant concentration is even more preferably at least $1 \times 10^{18}$ cm-3 to achieve a hole concentration of at least $1 \times 10^{18}$ cm-3. An example upper limit of the hole concentration in the back-barrier layer is $1 \times 10^{19}$ cm-3, and a corresponding p-type-dopant concentration to achieve this value is provided in the back-barrier layer according to one embodiment.

In an example, if no compensation effects occur, the p-type dopant concentration can be selected equal to the desired hole concentration. In view of dopant compensation effects, p-type dopant concentrations of a higher amount than the desired hole concentration may be required to achieve a desired hole concentration. In practice today, the dopant concentration of a p-type dopant must be higher than the desired hole concentration, in exemplary embodiments by a respective factor of 5, 10, 20, 50 or 100. The factor to be selected depends on processing conditions during fabrication of the layer structure, which for instance determine a concentration of defects that give rise to unintentionally incorporated n-type defect levels compensating a part of the intentionally incorporated p-type dopant atoms. Oxygen incorporation is an example of an often undesired, unintentional p-type doping.

Suitable p-type dopants are for example Mg or C.

The layer structure of the present invention allows fabricating a transistor with a positive shift in the threshold voltage beyond zero Volt, even for layer-structure embodiments with a cap layer that is identical to the electron-supply layer.

The layer structure can also comprise a cap layer on the electron-supply layer, the cap layer being made of a fourth group-III nitride material that has a smaller band gap than the electron-supply layer. Suitable examples of a cap layer are GaN, InGaN, AlGaN or AlGaInN, the latter two materials preferably having an Al-content that still achieves the lower band gap energy in comparison with the electron-supply layer. Generally, the cap-layer thickness is preferably below 10 nm to provide an additional contribution to a positive threshold voltage Vth. A combination of the back-barrier layer and a layer of InGaN grown as the cap layer allows reaching a threshold voltage Vth of beyond +1 V.

The cap layer can be of a p-type conductivity to further increase the threshold voltage. In particular, p-type doping is useful in combination with InGaN as the fourth group-III-nitride material. However, p-doping of the cap layer is preferably kept to a maximum amount of $1 \times 10^{18}$ cm-3 in terms of a hole concentration achieved. In other embodiments, the cap layer is not intentionally doped.

If AlGaN or AlInGaN is used as a cap-layer material, that is, as the fourth group-III-nitride material, care has to be taken to keep the thickness of the cap layer low enough to avoid shifting the threshold voltage towards the negative range that would result in normally-on characteristics.

Furthermore, if a dielectric material is used as a gate-dielectric material in conjunction with the layer structure (in some embodiments in a layer structure suitable for a MIS-HEMT), that is, on the cap layer or on the electron-supply layer, the threshold voltage of a normally-off transistor made from this layer structure can be increased further, and higher-saturated current capability may be achieved while maintaining a low leakage current. Suitable high-K materials are for instance Hf02 and Al2O3 and silicon nitride. While silicon nitride is easier to integrate in the fabrication process, it has a smaller effect on the threshold voltage than Hf02 and Al2O3. A dielectric-material layer can also help avoiding an undesired oxidation of underlying layers and thus increase the stability and reliability of a transistor made using this layer structure.

The thickness of the back-barrier layer influences the position of the lower conduction-band edge at the interface between the channel layer and the electron-supply layer. Different embodiments of the layer structure have a back-barrier layer with a thickness of higher than 20 nanometer. An example thickness range can be defined by the interval of thick-nesses larger than 50 nanometer, even more preferably at least 300 nanometer. A back-barrier layer, which can be grown on as a part of an epitaxial layer structure on a foreign substrate, has a crystal structure that is either fully relaxed or at least partially relaxed by the incorporation of lattice defects such as dislocations.

In view of that, one factor influencing the thickness selection is a desired amount of lattice mismatch of the back-barrier layer with an underlying buffer layer. If the lattice mismatch is small, a thickness in the range between 20 and 300 nm can be sufficient to achieve an at least partially relaxed back-barrier layer. If an even higher thickness of the back-barrier layer is used, the desired at least partially relaxed lattice can be achieved even in view of a larger lattice mismatch. For instance, thicknesses of at least 500 nm, at least 1000 nm or even higher values may be used. There is no upper limit to the back-barrier layer thickness from the design point of view in this regard. However, other considerations may lead to a limitation to about 2000 nm.

A thickness of the channel layer in the layer structure can also have an impact on the band structure. A net polarisation charge at an interface between the channel layer and the electron supply layer can be lower than at an interface between the channel layer and the back-barrier layer.

The channel layer can be preferably strained compressively by an at least partial adaptation of the lattice constant of the underlying back-barrier layer. Suitable channel-layer materials are for example InGaN or GaN when using an AlGaN back-barrier layer. The thickness of the channel layer is preferably at least 20 nm and lower than 200 nm. By optimizing the channel-layer thickness within this interval it is possible to employ a low Al mole fraction in an AlGaN back-barrier, which still allows achieving a larger band gap in the back-barrier layer than in the channel layer, thus still achieving high energy barrier at the interface between the channel layer and the back-barrier layer. In this regard, the thickness of the channel layer is preferably kept to at most 100 nm.

The electron-supply layer can be in one embodiment grown at a low thickness that allows incorporating a tensile strain.

Examples of the layer structure can further include a spacer layer made of AlGaN or AlN between the channel layer and the electron-supply layer, the AlN layer having a thickness of not more than 3 nanometer. If an AlGaN spacer layer is used, the Al mole fraction of the spacer layer is higher than that of the electron-supply layer.

A wafer containing the layer structure of the present invention can be fabricated starting from any suitable substrate for growing group-III-nitride layers. However, care has to be taken to provide a suitable high resistivity buffer-layer structure with a breakdown electric field strength of typically 1-3 MV/cm even higher that at the same time manages strain in the layer structure to avoid cracks and wafer bow and keeps the concentration of defects in the crystalline structure to an acceptably low value. Sheet defect densities achieved with a suitable buffer-layer structure are for instance in the range between 5×107 and 4×109 cm-2.

A substrate material can be silicon because it can be provided in large diameters with high purity at low cost. Furthermore, the use of a silicon substrate allows fabricating the normally-off transistor according to the present invention together with other silicon-based semiconductor devices, on a single wafer. Thus, the use of a silicon substrate even allows an integration of the fabrication of this transistor into a known highly-developed industrial process for the fabrication of an integrated circuit, such as a MOS, NMOS, PMOS, CMOS or BiCMOS process.

The group-III-nitride layer structure of the present invention or one of its embodiments disclosed herein can be incorporated in a respective embodiment of normally-off transistor according to the present invention. Such transistor thus includes the respective group-III-nitride layer structure.

A normally-off transistor according to the present invention also has source, gate and drain contacts. In a normally-off transistor according to the present invention, the lower conduction-band edge of the third group-III-nitride material in the channel layer is higher in energy than a Fermi level of the third group-III-nitride material in the channel layer. This applies at least in a lateral region of the channel layer, which approximately corresponds to the lateral extension of the gate contact. In the absence of an external gate-source voltage, and as long as a positive gate-source voltage below a threshold voltage amount Vth is applied, the channel is therefore not conductive, and the transistor is in an off-state. For switching to an on-state, a gate-source voltage higher than the threshold voltage amount has to be applied.

The normally-off transistor according to the present invention or one of its embodiments have respective advantageous properties, which correspond to those described in the context of the respective embodiments of the group-III-nitride layer structure.

An exemplary embodiment of the normally-off transistor can have an electrically conductive source, gate and drain contacts, which are typically made of a metal and which are disposed with respective lateral distances from each other directly on the layer structure. The group-III-nitride layer structure of this exemplary embodiment is free of recesses laterally between the source and gate contacts and between the gate and drain contacts. In other words, no fabrication of recesses in the lateral region between the source contact and the gate contact and between the gate contact and the drain contact is required in this embodiment.

Preferably, in such embodiments no recess extends into the group-III-nitride layer structure for accommodating at least one of the source, gate and drain contacts. Instead, the respective at least one of the source, gate and drain contacts is arranged directly on the cap layer or, if present, directly on the dielectric layer of the group-III-nitride layer structure.

In an embodiment, recesses are provided only for accommodating the source and drain contacts, but not for accommodating the gate contact. The recesses preferably reach vertically in the layer structure down to a channel region of the channel layer that carries a 2DEG in an on-state of the transistor. This way, particularly low on-resistance can be achieved. In this variant, recessing is not performed under the gate contact. In particular, using an embodiment of the layer structure, which has a high-K dielectric material under the gate contact allows a precise adjustment of the threshold voltage in the design process of a normally-off transistor. For the threshold voltage can be controlled more accurately by the design of the grown layer thicknesses and doping concentration in comparison to recess etching or ion treatment methods known from the prior art. Thus, a gate-recess-free chip design with particularly good normally-off performance is achieved.

In another embodiment, the normally-off transistor that incorporates the layer structure accord-ing to one of the embodiments disclosed herein is fabricated even without any recess etching at all. In such embodiments, the transistor has no recess at all. No patterning steps of the layer structure are required in such embodiments, and the contacts are applied directly to the layer structure. Source, gate and drain contacts are arranged directly on the electron supply layer, or on the cap layer, or on the gate dielectric layer, whichever forms the uppermost layer of the layer structure.

In some variants of such embodiments, a particularly low on-resistance can be achieved by allowing a diffusion of metal atoms from the source and drain contacts vertically into the layer structure, preferably down to the channel layer. Such diffusion of metal atoms from the source and drain contacts into the layer structure can be achieved by annealing after the deposition of the source and drain contacts. However, diffused metal atoms in the layer structure are not to be misunderstood as a requirement to achieve a normally-off transistor with good on-state characterisitics.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
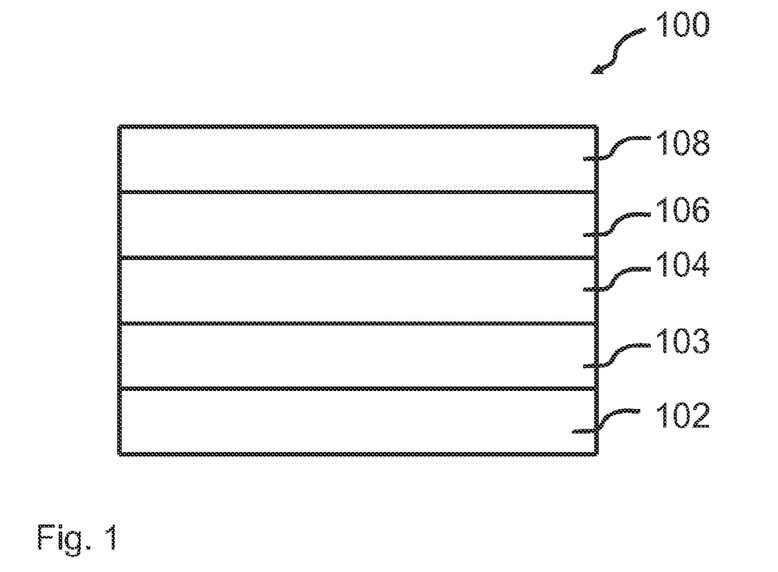
FIG. 1 shows a group-III-nitride layer structure according to an embodiment.

FIG. 1 shows a group-III-nitride layer structure according to an embodiment. Furthermore, only those layers are shown, which appear useful for conveying an understanding of the layer structure of the respective embodiment. However, this does not imply that all layers shown in a respective figure are in fact necessary to implement a layer structure according to the present invention.

The layer structure 100 is deposited on a substrate 102, which for instance is a silicon wafer. Other known substrate materials suitable for the deposition of group-III-nitride materials may be used. However, silicon can be preferred due to the economic and technological advantages involved in using industry-standard, large-scale wafers.

On the silicon wafer 102, a nucleation and buffer layer structure 103 is grown. The nucleation and buffer layer structure 103 typically has a sublayer structure in order to enable the growth of a crack-free, low-defect-density layer structure with a virtually vanishing wafer bow. In particular, the nucleation and buffer layer structure serves for adequately compensating stress in the layer structure, which is caused during the fabrication process by differences in lattice constants and coefficients of thermal expansion of the substrate and of the group-III-nitride materials grown on the substrate. Suitable nucleation and buffer layer structures are known in the art.

The layer structure 100 of the present embodiment is deposited on the nucleation and buffer layer structure 103 and comprises, according to the applied order of deposition, a back-barrier layer 104, a channel layer 106, and an electron-supply layer 108.

The back-barrier layer 104 is made of AlGaN. In the language of the claims, it forms an example of a second group-III-nitride material. The channel layer 106 is made of GaN or InGaN (third group-III-nitride material), and the electron-supply layer 108 is made of AlGaN (first group-III-nitride material).

There is considerable freedom in the specific selection of the Al and Ga mole fractions of the back-barrier layer 104 and the electron-supply layer 108. However, the channel layer is made of a third group-III-nitride material that has a band-gap energy that is lower than the band-gap energies of the first and second group-III-nitride materials. At the same time the band-gap energy of the first group-III-nitride material of the electron-supply layer 108 is smaller than the second band-gap energy of the second group-III-nitride material of the back-barrier layer 104.

The material of the back-barrier layer 104 is of p-type conductivity, while the material of the electron-supply layer 108 and the material of the channel layer 106 are not of p-type conductivity. Instead they are typically not doped intentionally. For group-III-nitride materials, this often implies that they are n-type.

The back-barrier layer has a thickness between 50 and 2000 nm. It is preferred that the back-barrier layer is unstrained or nearly unstrained and able to create a compressive strain in the channel layer deposited on it. The thickness may therefore be kept closer to the low end of this interval if the back-barrier layer is deposited with good lattice match on an underlying buffer layer. Preferably, the thickness is not more than 1000 nm.

The channel layer has a thickness of at least 15 nm. A thickness as low as 15 nm can be achieved in a molecular beam epitaxy (MBE) process. If a metal-organic chemical vapour deposition (MOCVD) technique is used for the abrication of the layer structure, the lower thickness limit for the channel layer is typically 20 nm. The channel-layer thickness is not higher than 200 nm. Preferably, the channel layer has a thickness of at most 100 nm.

The electron supply layer has a thickness of between 10 and 30 nm.

The layer structure achieves that, as long as no voltage beyond a threshold amount is applied to a transistor structure incorporating the layer structure, a lower conduction-band-edge of the third group-III-nitride material in the channel layer is higher in energy than a Fermi level of the third group-III-nitride material in the channel layer, in particular at the energy barrier near the interface between the channel layer and the electron supply layer. This will be explained in more detail in the following.

The present layer structure forms a so-called double heterostructure (DH). A first hetero-junction is formed at the interface of the channel layer 106 and the electron-supply layer 108. This interface regions accommodates a two-dimensional electron gas (2DEG) when a positive voltage of a suitable amount larger than a threshold voltage Vth is applied to a transistor structure comprising the layer structure 100. Due to the raised conduction band of the AlGaN back-barrier layer, the electron channel is located in a deep potential well that enables a good 2DEG confinement. Such a transistor structure typically forms a high-electron mobility transistor (HEMT). The channel layer 106 is separated from the nucleation and buffer layer structure 103 by a second heterojunction formed at the inter-face between the channel layer and the back-barrier layer. Thus, the layer structure 100 comprises an AlyGa1-yN/GaN/AlxGa1-xN or AlyGa1-yN/InGaN/AlxGa1-xN double-heterostructure.

Charge densities at the AlyGa1-yN/GaN interface and the GaN/AlxGa1-xN interface are caused by the different polarizations of the AlyGa1-yN back-barrier layer the GaN channel layer and the AlxGa1-xN electron-supply layer. The polarization generates a strong electric field inside the GaN channel layer which causes a strong modification to the lower conduction-band edge and the upper valence-band edge in the GaN channel layer. In particular, a negative polarization difference in the AlyGa1-yN/GaN interface generates an excess positive charge in a top section of the AlyGa1-yN/GaN of the back-barrier layer near the interface to the channel layer. This charge generates a back potential barrier, which can be interpreted as a polarization-induced p-type doping. On the other side, a positive polarization difference in the GaN/AlxGa1-xN interface generates an excess negative charge in a top section of the GaN channel layer near the interface to the electron-supply layer. Additional intentional p-type doping raises the lower conduction-band edge to a level that is higher than the Fermi level, thus allowing normally-off characteristics. The dopant concentration is preferably higher than 1×1018 cm-3. An overall hole concentration of at least 5×1017 cm-3, preferably at least 1×1018 cm-3 is advantageous for achieving good normally-off characteristics. As is well known, compensation effects have to be taken into account when adapting the dopant concentration to achieve a desired hole concentration. Since compensation effects may vary in dependence on the nature and concentration of defects incorporated into the layers in the growth process, the dopant concentration may have to be adapted accordingly, but is preferably kept to a level that does not result in exceeding a hole concentration of more than 1×1019 cm-2.

As a result, in the absence of an applied external voltage, no 2DEG is formed due to the layer structure 100, thus giving rise to normally-off characteristics of such a transistor structure. This DH-HEMT also has the potential for high mobility and high maximum electron concentration. A 2DEG is only formed under application of a positive voltage higher than a threshold amount.

Figure 2:
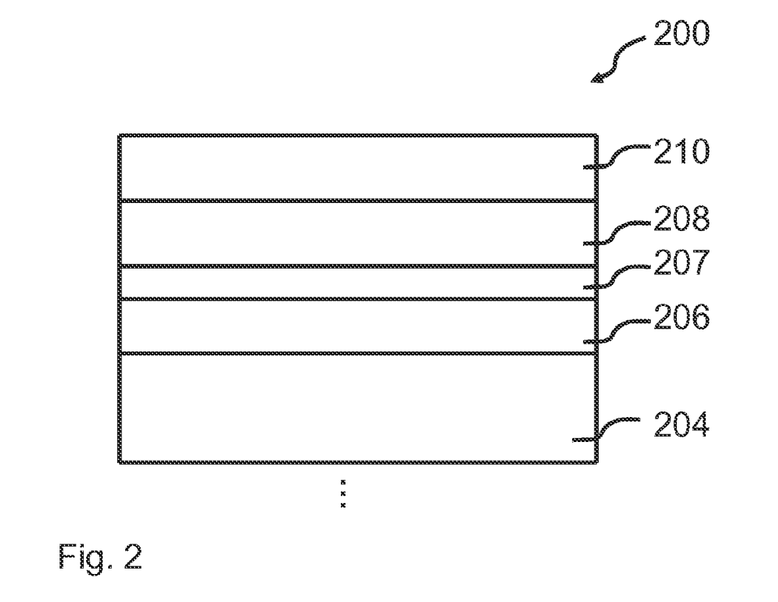
FIG. 2 shows a group-III-nitride layer structure according to an embodiment.

FIG. 2 shows a schematic illustration of a layer structure 200 according to a second embodiment. The buffer-layer structure is omitted from the figure. The structure is similar to that of FIG. 1 in that it has a back-barrier layer 204, a channel layer 206, and an electron-supply layer 208. The present embodiment differs from that of FIG. 1 in the addition of a spacer layer 207 between the channel layer 206 and the electron-supply layer 208. In the present embodiment, the spacer layer 207 is made of AlN and has a thickness of 3 nm at most, preferably only 1 to 2 nm. In a variant, the spacer layer is made of AlGaN. Any Al mole fraction larger than 35% is suitable. Furthermore, on top of the electron-supply layer, a cap layer 210 is provided. The cap layer 210 is in the present embodiment made of GaN. It may alternatively be made of InGaN. The thickness of the cap layer is between 2 and 10 nm, preferably 4 nm.

In all embodiments of the present specification, the spacer layer 207 is an optional layer that can be omitted without affecting the normally-off characteristics of the layer structure. The spacer layer 207, which may also be called an intermediate layer, is advantageous because it helps screening the channel from scattering processes, including scattering of electrons in the 2DEG by acoustic or optical phonons, ionized impurities or interface roughness. The room-temperature electron mobility and carrier density are observed to increase with insertion of the spacer layer.

The cap layer additionally helps raising the lower conduction-band edge above the Fermi level in the channel layer and can therefore further increase the threshold voltage.

Figure 3:
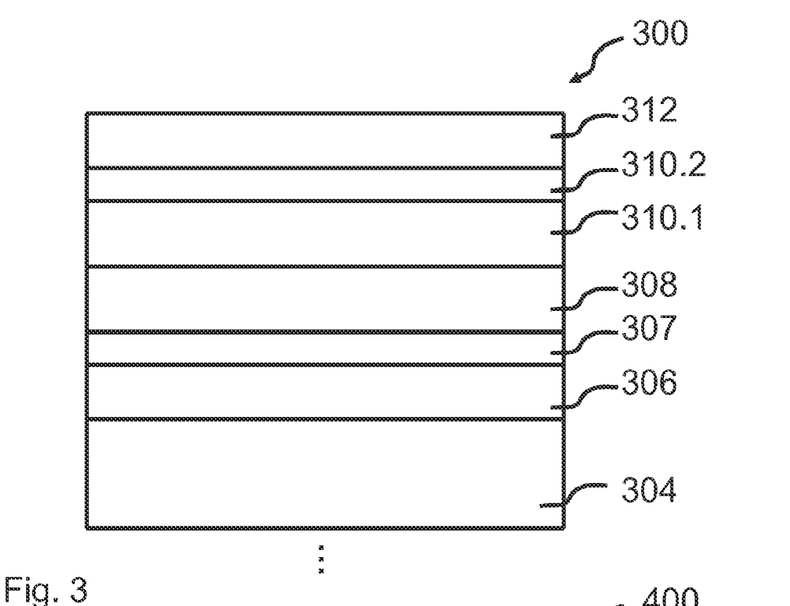
FIG. 3 shows a group-III-nitride layer structure according to an embodiment.

FIG. 3 shows a schematic illustration of a layer structure 300 according to a third embodiment. The buffer-layer structure is not shown. The structure is similar to that of FIG. 2 in that it has a back-barrier layer 304, a channel layer 306, a spacer layer 308, an electron-supply layer 310 and a cap layer 312. It differs from the embodiment of FIG. 2 in that the electron-supply layer is compositionally graded. In the present embodiment, the electron-supply layer comprises two sublayers 310.1 and 310.2. However, the structure may be varied to comprise a larger number of sublayers. The present embodiment is an example of a layer structure, in which the compositional grading of the electron-supply layer achieves a decrease of the band gap of the electron-supply layer 310 with increasing distance from the channel layer 306. Specifically, in the present embodiment, the first sublayer 310.1 has a larger band gap than the second sublayer 310.2. For in-stance, the first sublayer 310.1 is made of AlGaN with an Al mole fraction of between 20% and 30%. In one example, the Al mole fraction of the first sublayer 310.1 is 26%. In contrast, the second sublayer 310.2 may be made of AlGaN with an Al mole fraction of between 15% and 20%. In a combination of the example of the first sublayer 310.1 just mentioned, (26%) the second sublayer may have an Al mole fraction of 16%. The overall thickness of the electron-supply layer is between 15 and 30 nm. In one example, it is 20 nm. Preferably, the first sublayer 310.1 has a larger thickness than the second sublayer 301.2. The first sublayer may be more than twice or more than three times as thick as the second sublayer. In one example, the thickness of the first sublayer 310.1 is 16 nm, and the thickness of the second sublayer 310.2 is 4 nm.

With respect to the properties and parameters of the other layers of the layer structure 300, reference is made to the description of the embodiment of FIG. 3.

Using compositional grading within the electron supply layer serves multiple purposes. It first reduces the overall polarization field in the electron-supply layer, which makes it easier to deplete the channel for normally-off operation. It also reduces the strain and the risk of cracking in this layer.

Figure 4:
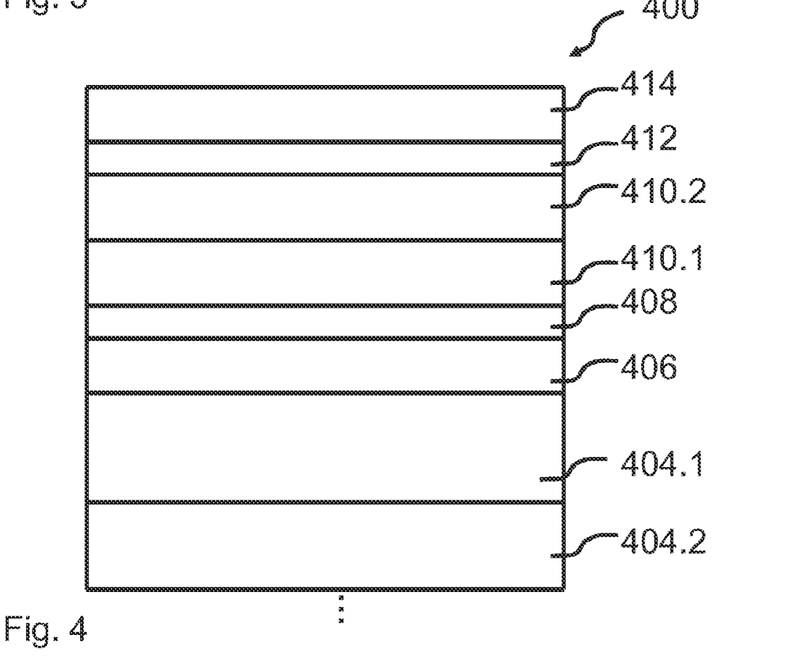
FIG. 4 shows a group-III-nitride layer structure according to an embodiment.

FIG. 4 shows a schematic illustration of a layer structure 400 according to a fourth embodiment. Again, the buffer-layer structure is not shown. The layer structure 400 is similar to that of FIG. 3 in that it has a back-barrier layer 404, a channel layer 406, a spacer layer 408, an electron-supply layer 410 made of two sublayers 410.1 and 410.2, and a cap layer 412.

The layer structure 400 of FIG. 4 differs from the embodiment of FIG. 3 in the addition of a dielectric layer 414 on the cap layer, and in that the back-barrier layer is also compositionally graded.

The dielectric layer 414 is preferably a high-K material. Suitable dielectric materials are hafnium-based dielectrics such as HfO2 or HfSiON, zirconium-based dielectrics such as ZrO2 or zirconium silicate, Al2O3, SiON, or Si3N4. It has a thickness of between 5 and 25 nm, preferably between 7 and 20 nm.

In the present embodiment, the back-barrier layer 404 comprises two sublayers 404.1 and 404.2. However, the structure may be varied to comprise a larger number of sublayers. For instance, in a variant that can be used also in the embodiments of FIGS. 1 to 3, a superlattice of alternating AlGaN and GaN layers may form the back-barrier layer 404.

Grading, for instance continuously or by using multiple AlGaN sublayers of different compositions within the back-barrier layer 404, makes the growth sequence easier to fabricate and also reduces the overall strain and stress in the layer. When combined with a buffer structure, a graded or stepped approach of the Al % also reduces a risk of para-sitic channel formation at a bottom of the AlGaN back-barrier layer. With respect to the properties and parameters of the other layers of the layer structure 400, reference is made to the description of the embodiment of FIG. 3.

Figure 5:
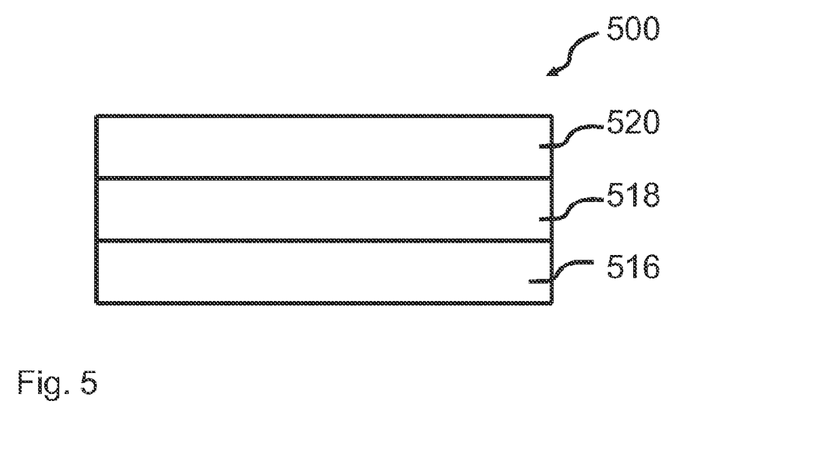
FIG. 5 shows a buffer-layer structure that may be used in combination with any of the layer structures of the previous embodiments.

FIG. 5 is an illustration of a buffer-layer structure 500 that may be used in combination with any of the layer structures of the previous embodiments. The buffer-layer structure 500 is known as such, and for the purpose of the present description assumed to be used in combination with a layer structure according to any of the embodiments of the present invention. The substrate, on which the buffer layer structure is grown, is not shown in FIG. 5. The buffer layer structure 500 comprises a first buffer layer 516, which may for instance have substructure including a nucleation layer, e.g., AlN, a lattice-adaptation layer and a stress-management layer. The lattice-adaptation layer may be a compositionally graded layer made of AlGaN or InAlGaN or a superlattice. The stress-management layer may comprise a sequence of different layers introducing a stress component that is opposite to the stress caused by the lattice mismatch and the thermal expansion differences between the substrate and the materials grown on the substrate. It may comprise AlGaN and GaN layers. On a silicon substrate, a suitable thickness of the first buffer layer is in the range between 2 to 6 μm, for instance 4 μm.

A second buffer layer 518 may be made of GaN and have a thickness between 1 and 2 μm, for instance 1.5 μm. A third buffer layer may be made of AlGaN, preferably with a low Al mole fraction, lower than 10%. In one example it has a thickness between 50 and 1000 nm.

Figure 6:
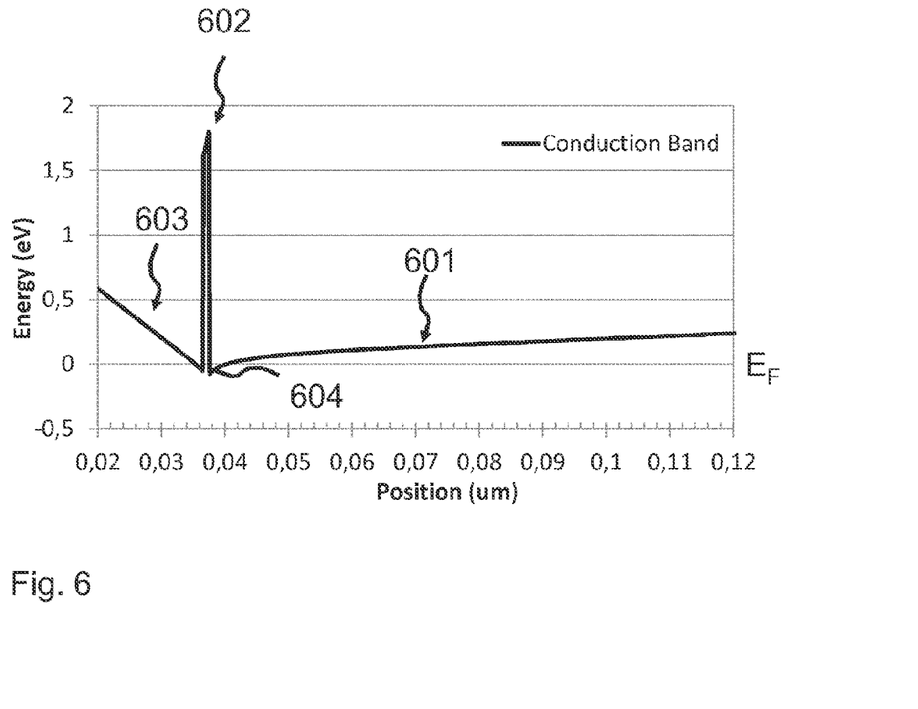
FIG. 6 shows a conduction-band profile in a layer structure for a HEMT transistor according to the prior art.

FIG. 6 shows a conduction-band profile in a layer structure for a HEMT transistor according to the prior art. The conduction-band profile shows the energy level of the lower conduction-band edge in units of eV on a linear scale along the vertical axis (ordinate), plotted as a function of a position in a depth direction along the horizontal axis (abscissa), shown in linear units. The uppermost layer of the prior-art layer structure is on the left side adjacent to the ordinate. The prior-art layer structure comprises the following layers:

TABLE 1

Prior art layer structure, cf. FIG. 6

| Layer | Composition | Thickness |
| --- | --- | --- |
| (not shown) | Conductor | ~4 nm |
| (not shown) | GaN | ~20 nm |
| 603 | AlGaN, x = 23% | ~20 nm |
| 602 | AlN | <1 nm |
| 601 | GaN | ~1500 nm |

As can be seen, the resulting lower conduction-band profile has a minimum 504 at the interface between the GaN channel layer 601 and the AlN spacer layer 603, which has an energy that is lower than the Fermi energy (at 0 eV in FIG. 6). This minimum leads to the spontaneous formation of a 2DEG even without applying an operation voltage to the layer structure.

Figure 7:
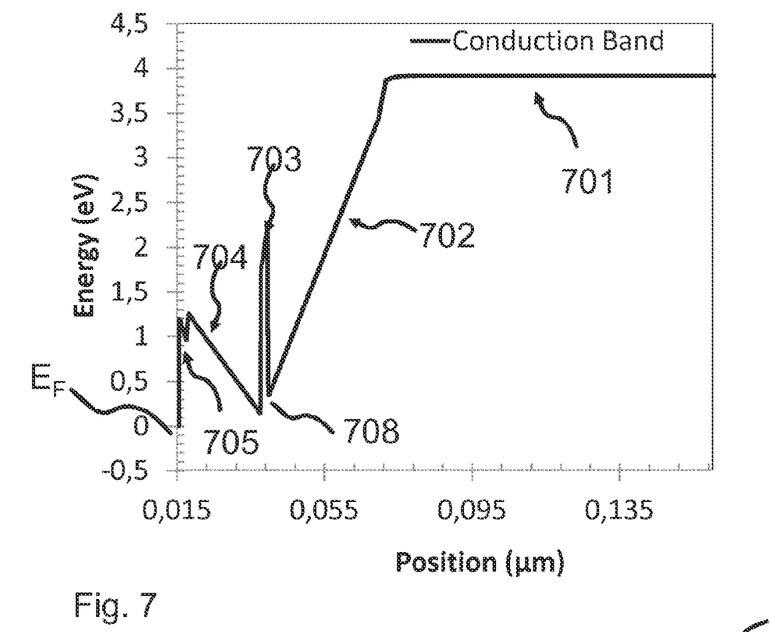
FIG. 7 shows a conduction-band profile in an embodiment of layer structure for a normally-off transistor according to the present invention.
Figure 8:
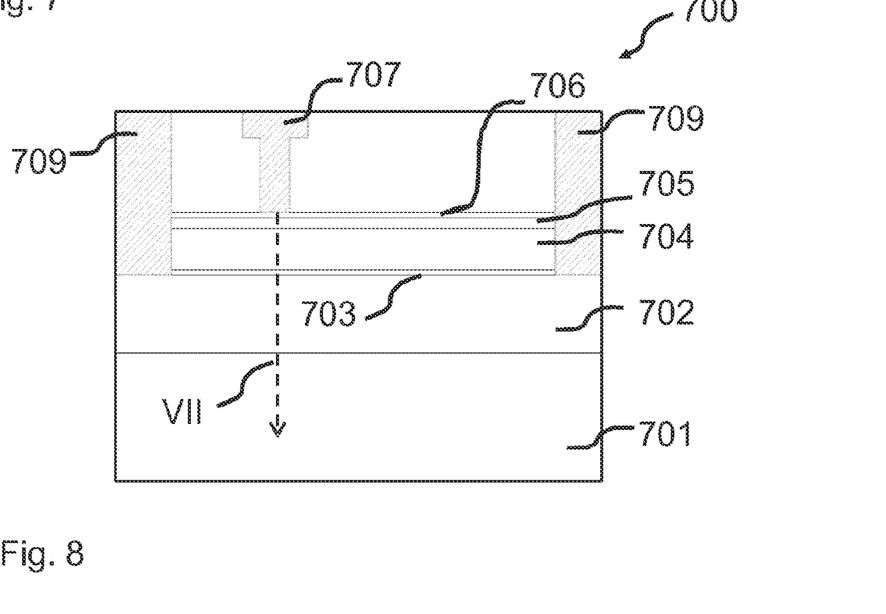
FIG. 8 shows an embodiment of a normally-off HEMT according to the present invention that has the conduction-band profile shown in FIG. 7.

FIG. 7 shows an illustration of a conduction-band profile in an embodiment of a normally-off transistor 700 according to the present invention and shown in FIG. 8. The graphical representation of FIG. 6 corresponds to that explained for FIG. 6. Parameter details of the layer structure underlying the conduction-band profile are given below in Table 2. The conduction-band profile of FIG. 7 is taken under a metallic gate contact 707, as indicated by an arrow VII drawn with a dashed line in FIG. 8. The transistor design 700 is free of recesses under the gate contact 707 and laterally between the gate contact 707 and the source contact 709 (to the left) and the drain contact 701 (to the right). The source and drain contact 709 and 710 are accommodated in recessed areas extending down to the upper edge of the channel layer 702, at which level, in operation of the transistor in an on-state, a 2DED forms.

As can be seen, the resulting lower conduction-band structure profile has a minimum 708 at the interface between the GaN channel layer 702 and the AlN spacer layer 703.

However, the minimum has an energy that is higher than the Fermi energy EF at 0 eV. This avoids formation of a 2DEG without applying an external operational voltage to the layer structure. The layer structure is therefore suitable for a normally-off HEMT.

TABLE 2

Layer structure underlying the conduction-band profile shown in FIG. 7

| Label | Layer Composition | Thickness |
| --- | --- | --- |
| 707 | Gate contact Conductor | any |
| 706 | Cap layer GaN | 2 nm |
| 705 | Electron-supply layer $Al_xGa_{1-x}N$, x = 16% | 4 nm |
| 704 | $Al_xGa_{1-x}N$, x = 26% | 16 nm |
| 703 | Spacer layer AlN | 1-3 nm |
| 702 | Channel layer GaN | 20-100 nm |
| 701 | Back-barrier layer $Al_yGa_{1-y}N$, y > 26% p-doped >1e18/cm3 | |
| | p-doped >1e18/cm3 | >50 nm |

Figure 9:
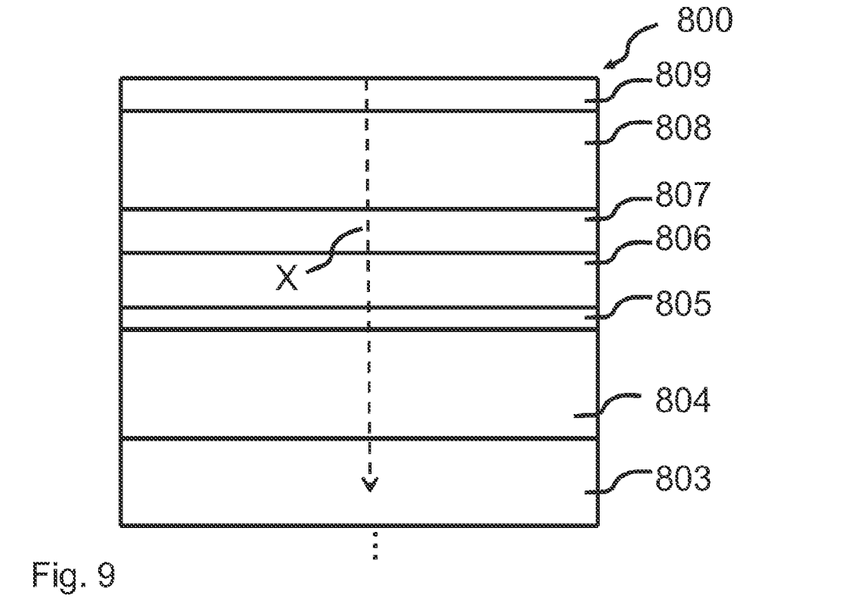
FIG. 9 shows an embodiment of a normally-off HEMT according to the present invention that has the conduction-band profile shown in FIG. 7.
Figure 10:
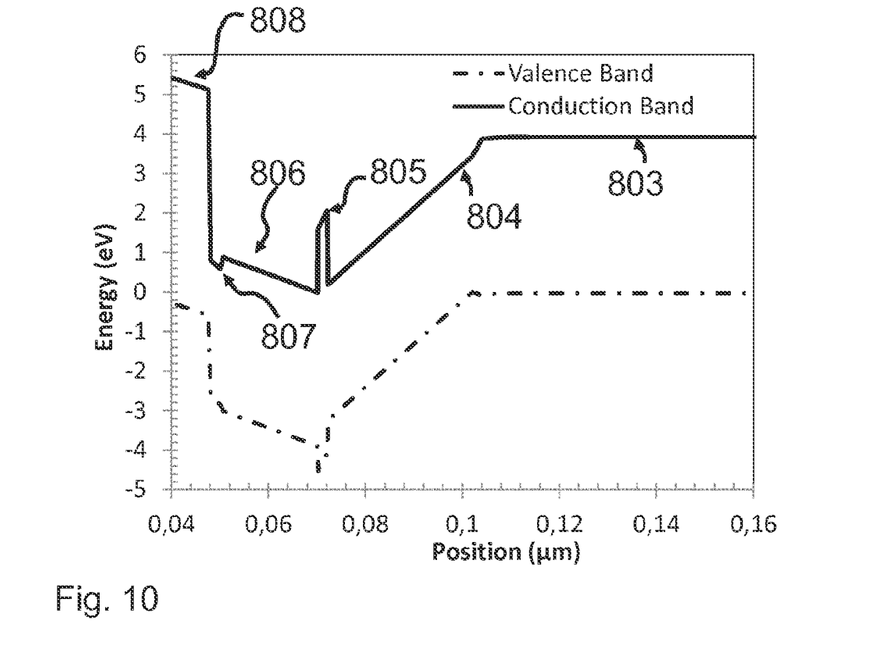
FIG. 10 shows the resulting band profiles for both the upper valence-band edge and the lower conduction-band edge at a fixed lateral position under the gate contact of the HEMT of FIG. 9.

FIGS. 9 and 10 show an embodiment of a normally-off HEMT 800. FIG. 9 shows the structure of the HEMT 800 in a schematic cross-sectional view, and FIG. 10 shows a valence and conduction-band profile. The HEMT 800 is based on a layer structure as shown in Table 3. A gate contact 809 is arranged in a lateral position between source and gate contacts (not shown) and is vertically adjacent to a gate dielectric layer 808. The band structure shown in FIG. 10 applies underneath the gate contact 809, and the direction of increasing position coordinates is indicated by the arrow X in FIG. 9. FIG. 10 shows the resulting band profile for both the upper valence-band edge (lower trace, dashed line) and the lower conduction-band edge (upper trace, full line) at a fixed lateral position under the gate contact of the HEMT 800. As can be seen, the HEMT 800 is a normally-off HEMT due to the minimum of the lower conduction-band edge being at an energy level higher than the Fermi level in the upper region of the channel layer 804. Again, normally-off characteristics are achieved for the transistor of FIG. 9 with the detailed layer structure shown below in Table 3.

TABLE 3

Layer structure of FIG. 8, underlying the simulation results shown in FIG. 9

| Layer | Layer Composition | Thickness |
| --- | --- | --- |
| 809 | Gate contact Conductor | any |
| 808 | Gate dielectric Hf02 | 7-20 nm |
| 807 | Cap layer GaN | 2 nm |
| 806 | Electron-supply layer AlGaN, x = 16 . . . 26% | 16 . . . 20 nm |
| 805 | Spacer layer AlN layer | 1-2 nm |
| 804 | Channel layer GaN | 20-100 nm |
| 803 | Back-barrier layer AlGaN, x > 26% * p-doped > 1e18/cm3 | >50 nm |
| (not shown) | Buffer AlGaN, x = 1% | 50-1000 nm |
| (not shown) | Buffer GaN | ~1500 nm |

The gate for the normally-off device can be driven towards higher positive voltages when the dielectric layer 809 is used. This then enables Imax values close to those of normally-on devices. A p-doped InGaN cap layer may be used instead of an undoped GaN cap layer 808 to further enhance the threshold voltage Vth towards more positive values, which typically are in the range between 2 and 6 V.

Figure 11:
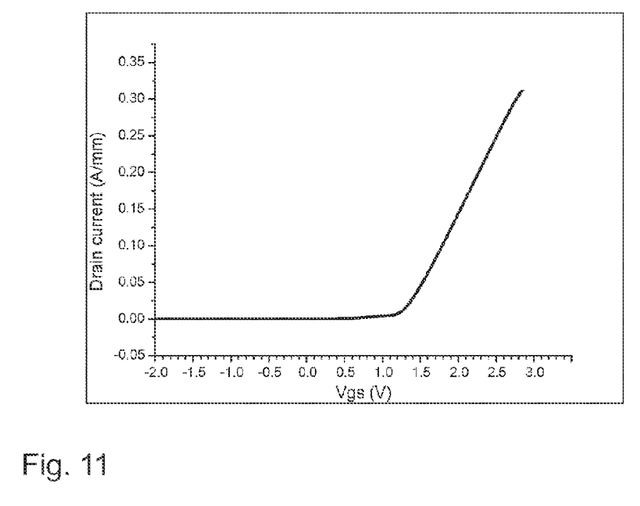
FIG. 11 shows a drain current in Ampere plotted against a gate voltage for the normally-off HEMT structure of FIG. 9.

FIG. 11 shows a drain current in Ampere plotted on a linear scale against a gate voltage in Volt at a drain-source voltage Vd of 300 V for the normally-off HEMT structure of in Table 3 and FIG. 10. The threshold voltage is at about 1.3 V.

Figure 12:
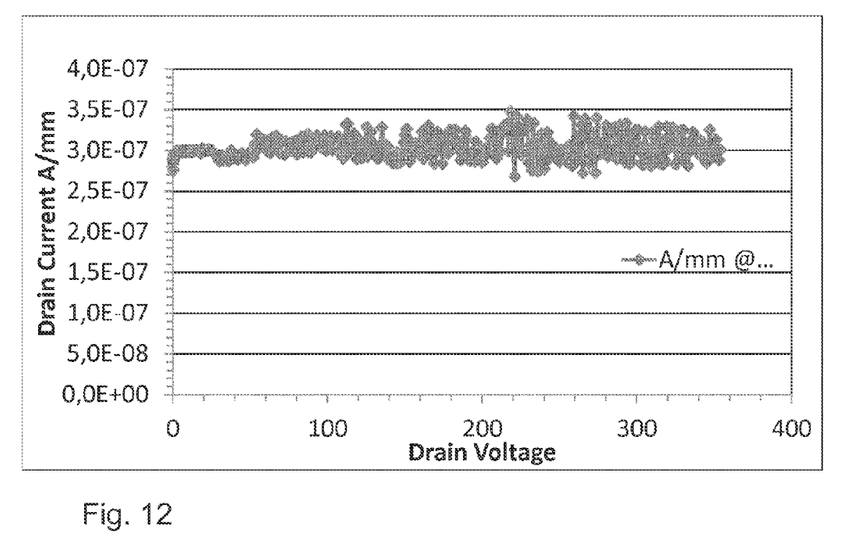
FIG. 12 shows the drain current versus drain voltage at Gate voltage of 0V (Off-state) for the normally-off HEMT structure of of FIG. 9.

FIG. 12 shows the drain current versus the drain voltage at a gate voltage of 0V (Off-state) for the normally-off HEMT structure 800 of FIG. 8 and Table 3. The Id-on/Id-off radio is found to be >106.

Figure 13:
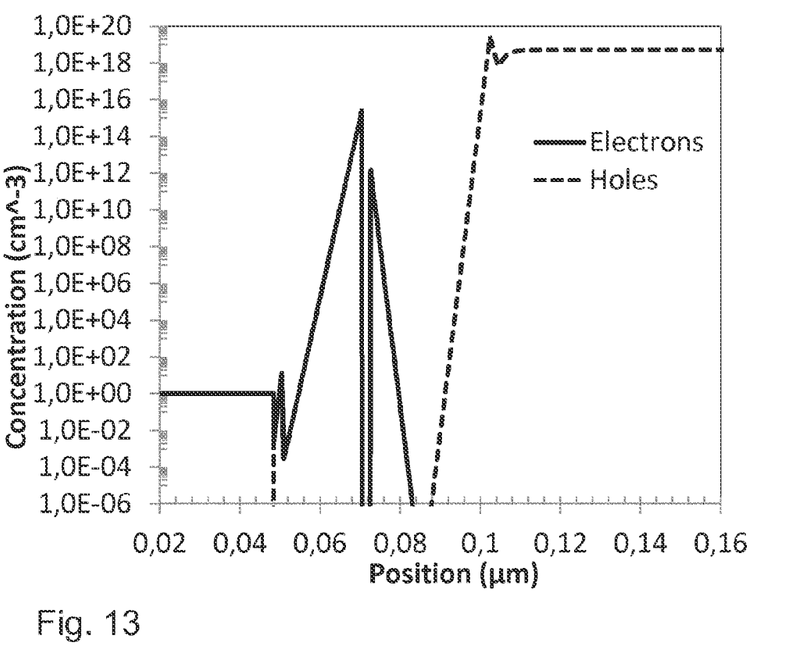
FIG. 13 shows calculated electron and hole concentration profiles for the normally-off HEMT structure of FIG. 9 taken at a drain voltage of 300V and a gate voltage of 0V.

FIG. 13 shows a result of a simulation of electron- and hole-concentration profiles for the normally-off HEMT structure of FIG. 8 and Table 3 taken at a drain voltage of 300V and a gate voltage of 0V. The profile shows that the electron concentration at the 2DEG that is generated between the AlN spacer layer 805 and the GaN channel layer 804 has its maximum at 5×1015/cm-3, whereas the hole concentration is very low and increases towards the interface of the GaN channel layer and the AlGaN back-barrier layer. A very low electron concentration within the 2DEG and at the same time a hole concentration at a peak value of 1×1018/cm-3 are found at the interface of the GaN channel layer and the AlGaN back-barrier layer, confirming the normally-off structure operation.

Figure 14:
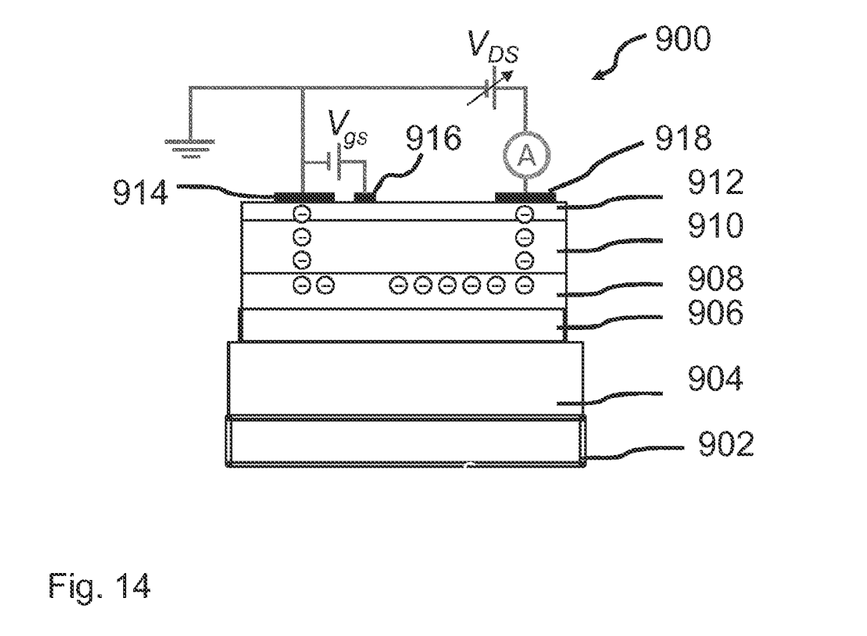
FIG. 14 shows a recess-free transistor design according to an embodiment of the present invention.

FIG. 14 shows a schematic illustration of as transistor having a fully recess-free design in accordance with an embodiment of the present invention. The layer structure of the transistor is shown in a simplified manner. On a Si substrate 902, a buffer-layer structure 904 is provided. On the buffer-layer structure 904, a p-doped back barrier 906 layer, a channel layer 908, an electron-supply layer and a cap layer 912 are provided. The back-barrier layer 906 has a larger band gap than the electron-supply layer 910. Additional layers may be present, as shown for other embodiments in the previous parts of the description. On the cap layer 912, a source contact 914, a gate contact 916 and a drain contact 918 are deposited in a recess-free design, that is, directly on the cap-layer 912. Without application of a gate-source voltage Vgs larger than a threshold voltage, the transistor is in an off-state, as shown in FIG. 14. This is indicated in FIG. 14 by circles symbolizing negative charge carriers, i.e., electrons, that are able to form a conductive channel in the channel layer 908, which, however, is interrupted in the off-state shown.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A group-III-nitride layer structure for a normally-off transistor, the layer structure comprising:
   an electron-supply layer made of at least one first group-III-nitride material having a first band-gap energy;
   a back-barrier layer made of at least one second group-III-nitride material having a second band-gap energy; and
   a channel layer, which is arranged between the electron-supply layer and the back- barrier layer and which is made of a third group-III-nitride material having a third band-gap energy that is lower than the first and second band-gap energies,
   wherein the second group-III-nitride material of the back-barrier layer is of p-type conductivity,
   wherein the first group-III-nitride material of the electron-supply layer and the third group-III-material of the channel layer are not of p-type conductivity,
   wherein the first band-gap energy of the first group-III-nitride material of the electron-supply layer is smaller than the second band-gap energy of the second group-III-nitride material of the back-barrier layer; and
   wherein, in an absence of an external voltage applied to the layer structure, a lower conduction-band-edge of the third group-III-nitride material in the channel layer is at a higher energy level than a Fermi level of the third group-III-nitride material in the channel layer.

2. The group-III-nitride layer structure of claim 1, wherein the back-barrier layer and the electron-supply layer are made of AlGaN, and wherein the channel layer is made of GaN or InGaN.

3. The group-III-nitride layer structure of claim 1, wherein the electron-supply layer comprises AlGaN having an Al mole fraction of at least 15% and not more than 26%, and wherein the back-barrier layer comprises AlGaN having Al mole fraction of at least 25%.

4. The group-III-nitride layer structure of claim 1, wherein the electron-supply layer comprises AlGaN or AlInGaN or AlInN.

5. The group-III-nitride layer structure of claim 4, wherein the electron-supply layer exhibits a compositional gradient in that an Al mole fraction of the a first group-III-nitride material of the electron-supply layer is higher at a smaller first distance from the channel layer than at a larger second distance from the channel layer.

6. The group-III-nitride layer structure of claim 1, wherein the back-barrier layer comprises AlGaN and wherein an Al mole fraction of the a second group-III-nitride material of the back-barrier layer at a first distance from the channel layer and at a second distance from the channel layer differ from each other.

7. The group-III-nitride layer structure of claim 1, wherein the back-barrier layer has a p-type-dopant concentration of at least $1 \times 10^{17}$ cm$^{-3}$.

8. The group-III-nitride layer structure of claim 1, further comprising an either unintentionally doped or p-doped cap layer on the electron-supply layer.

9. The group-III-nitride layer structure of claim 8, further comprising a dielectric layer on the electron supply layer or on the cap layer.

10. The group-III-nitride layer structure of claim 1, wherein the back-barrier layer has a thickness of at least 20 nanometer or at least 50 nanometer, and wherein a thickness of the channel layer is at least 15 nanometer and lower than 200 nanometer.

11. The group-III-nitride layer structure of claim 1, further comprising a spacer layer between the channel layer and the electron-supply layer, the spacer layer having a thickness of not more than 3 nanometer and being made of AlN or AlGaN having a higher Al mole fraction than the electron-supply layer.

12. A wafer, comprising a group-III-nitride layer structure according to claim 1 formed on a substrate.

13. A normally-off transistor, comprising a group-III-nitride layer structure of claim 1.

14. The normally-off transistor of claim 13, comprising electrically conductive source, gate and drain contacts disposed with respective lateral distances from each other directly on the layer structure, wherein the group-III-nitride layer structure is free of recesses laterally between the source and gate contacts and between the gate and drain contacts.

15. The normally-off transistor of claim 13, wherein at least one of the source, gate and drain contacts is arranged directly on the cap layer or, if present, directly on the dielectric layer of the group-III-nitride layer structure and wherein no recess extends into the group-III-nitride layer structure for accommodating the respective at least one of the source, gate and drain contacts.

16. An integrated circuit, comprising a normally-off transistor according to claim 13.

17. The group-III-nitride layer structure of claim 1, further comprising:
   a first hetero-junction formed between the channel layer and the electron-supply layer; and
   a second hetero-junction formed between the channel layer and the back-barrier layer.

18. The group-III-nitride layer structure of claim 17, wherein the first hetero-junction has a negative polarization difference, and wherein the second hetero-junction has a positive polarization difference.

19. The group-III-nitride layer structure of claim 1, wherein, in the absence of the external voltage applied to the layer structure, conduction band energies of the electron-supply layer, the back-barrier layer, and channel layer are higher than the Fermi level of the third group-III-nitride material in the channel layer.

20. The group-III-nitride layer structure of claim 1, wherein, in the absence of the external voltage applied to the layer structure, no two-dimensional electron gas region is present.

\* \* \* \* \*